United States Patent
Chang et al.

(10) Patent No.: US 11,069,547 B2
(45) Date of Patent: Jul. 20, 2021

(54) IN-SITU TEMPERATURE MEASUREMENT FOR INSIDE OF PROCESS CHAMBER

(71) Applicant: Applied Materials, Inc., Santa Clara, CA (US)

(72) Inventors: Xue Yang Chang, San Jose, CA (US); Andrew Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 504 days.

(21) Appl. No.: 15/880,086

(22) Filed: Jan. 25, 2018

(65) Prior Publication Data
US 2018/0254208 A1    Sep. 6, 2018

Related U.S. Application Data

(60) Provisional application No. 62/466,136, filed on Mar. 2, 2017.

(51) Int. Cl.
*G01J 5/00* (2006.01)
*H01L 21/67* (2006.01)
(Continued)

(52) U.S. Cl.
CPC ...... *H01L 21/67248* (2013.01); *G01J 5/0007* (2013.01); *G01J 5/047* (2013.01);
(Continued)

(58) Field of Classification Search
CPC .. G01J 3/0202; G01J 3/027; G01J 5/04; G01J 3/4535; G01J 5/025; G01J 5/026;
(Continued)

(56) References Cited

U.S. PATENT DOCUMENTS 4,518,307 A * 5/1985 Bloch ................ B25J 17/0208
414/729
4,523,100 A * 6/1985 Payne .................... B25J 9/1015
250/559.33
(Continued)

FOREIGN PATENT DOCUMENTS

JP      407273099 A  *  7/1995
JP      11156769 A   *  6/1999
(Continued)

*Primary Examiner* — Gail Kaplan Verbitsky
(74) *Attorney, Agent, or Firm* — Patterson + Sheridan, LLP

(57) ABSTRACT

Apparatuses and methods for in-situ temperature measurement of a process chamber are described herein. A process chamber includes an infrared (IR) sensor mounted to the chamber wall. The IR sensor is mounted such that it can be oriented to receive an IR wave from targets within the process chamber through a view port in the chamber wall to detect a temperature of a surface inside the chamber, or to receive an IR wave from a target outside of the process chamber to detect an atmospheric temperature or a temperature of an exterior surface of the process chamber. As the orientation of the IR sensor is controllable to receive the IR wave from selected directions, it may be used to detect the temperature of various targets inside and outside the process chamber. The obtained temperature information is useful to improve overall chamber matching, processing throughput, and uniformity.

17 Claims, 5 Drawing Sheets

(51) Int. Cl.
  *H01L 21/02* (2006.01)
  *G01J 5/08* (2006.01)
  *G01J 5/04* (2006.01)
(52) U.S. Cl.
  CPC ...... *G01J 5/0853* (2013.01); *H01L 21/02301* (2013.01); *H01L 21/6719* (2013.01)
(58) Field of Classification Search
  CPC .... G01J 5/047; G01J 5/084; G01J 5/00; G01J 2005/0077; G01J 2005/0081; G01J 5/0007; G01J 5/02; H01L 21/67259; H01L 21/67248; H01L 51/56; G01K 7/003
  See application file for complete search history.

(56) References Cited

U.S. PATENT DOCUMENTS

| | | | | |
|---|---|---|---|---|
| 5,386,117 A * | 1/1995 | Piety | ............ | G01N 25/72 250/330 |
| 5,963,749 A * | 10/1999 | Nicholson | ............ | F16M 11/105 396/421 |
| 6,062,729 A | 5/2000 | Ni et al. | | |
| 6,536,944 B1 * | 3/2003 | Archibald | ............ | B01J 19/0046 219/497 |
| 6,702,459 B2 * | 3/2004 | Barnes | ............ | A61B 6/4405 250/522.1 |
| 7,408,137 B2 * | 8/2008 | Sawachi | ............ | G01C 21/20 250/208.1 |
| 7,560,007 B2 | 7/2009 | Gaff | | |
| 9,713,870 B2 * | 7/2017 | Shi | ............ | B25J 9/1697 |
| 9,827,678 B1 * | 11/2017 | Gilbertson | ............ | A47L 11/24 |
| 9,995,631 B2 * | 6/2018 | Pergande | ............ | H04N 5/33 |
| 2003/0047559 A1 * | 3/2003 | Watanabe | ............ | H05B 6/6455 219/711 |
| 2009/0088639 A1 * | 4/2009 | Maschke | ............ | A61B 8/4218 600/443 |
| 2016/0327383 A1 * | 11/2016 | Becker | ............ | G01B 11/005 |
| 2017/0020615 A1 * | 1/2017 | Koenig | ............ | A61B 46/10 |
| 2018/0080841 A1 * | 3/2018 | Cordoba | ............ | A61B 34/77 |
| 2018/0172428 A1 * | 6/2018 | Bridges | ............ | H04N 5/2252 |
| 2018/0221038 A1 * | 8/2018 | Noonan | ............ | A61B 1/00085 |
| 2019/0237354 A1 * | 8/2019 | Liu | ............ | H01L 21/68707 |
| 2019/0240780 A1 * | 8/2019 | Yang | ............ | B23K 26/22 |
| 2020/0024853 A1 * | 1/2020 | Furrer | ............ | B25J 9/0087 |

FOREIGN PATENT DOCUMENTS

| | | | |
|---|---|---|---|
| JP | 02001201587 A | * | 7/2001 |
| JP | 02002039539 A | * | 2/2002 |

* cited by examiner

IN-SITU TEMPERATURE MEASUREMENT FOR INSIDE OF PROCESS CHAMBER

CROSS-REFERENCE TO RELATED APPLICATIONS

This application claims benefit of U.S. Provisional Patent Application Ser. No. 62/466,136, filed Mar. 2, 2017, which is herein incorporated by reference in its entirety.

BACKGROUND

Field

Examples of the present disclosure generally relate to semiconductor processing, and more specifically, to apparatuses and methods for in situ temperature measurement for inside of a semiconductor process chamber.

Description of the Related Art

Semiconductor devices are commonly fabricated by a series of processes in which layers are deposited on a surface of a substrate and the deposited material is etched into desired patterns. As semiconductor device geometries decrease, precise process control during these processes becomes more and more important.

Temperature control is particularly important to achieve repeatable semiconductor manufacture with improved yield and high throughput in chambers, such as etch chambers, for semiconductor processing. This is because precise manufacturing techniques have small process window, and even slight excursions out of acceptable process control tolerances can lead to catastrophic amounts of production defects. For example, when the temperature of the etch chamber lid is too low, there is an increased risk of polymer deposition which can undesirably alter etch sidewall profiles. When, for example, the temperature of the etch chamber lid is too high, there is an increased risk of films on the lid cracking and flaking off, which may cause defects on the substrate. Furthermore, temperature drift of the etch chamber lid will also undesirably cause processing results to vary from substrate to substrate.

Conventionally, temperature information of etch chamber lids is typically obtained by measuring the surface temperature on the atmospheric (i.e., exterior) side of the lid. However, the atmospheric side of the lid may be significantly cooler than the interior side of the lid that faces the substrate being processed and other internal chamber components. Since the temperature of the interior surface of the etch chamber lid has greater impact on the temperature of the substrate, processing conditions and consequently processing results, monitoring the temperature of the atmospheric side of the chamber lid does not provide dispositive information for precisely controlling processing results.

Therefore, there is a need for an improved method and apparatus for monitoring temperature of a lid and other internal chamber components in a semiconductor process chamber.

SUMMARY

Apparatuses and methods for in situ temperature measurement of a process chamber are described herein. In one example, a process chamber includes a chamber body having walls and a lid, a view port disposed through at least one chamber wall, the view port having a window transmissive to IR radiation, an IR sensor mounted adjacent the view port, and a mounting system operable to orient the IR sensor to view targets within a field of view inside the process chamber.

In another example, an in-situ temperature measurement kit includes a mounting bracket coupled to a first intermediate bracket by a first actuator, a second intermediate bracket coupled to the first intermediate bracket by a second actuator, and an IR sensor mounting bracket coupled to the second intermediate bracket by a third actuator. The first motor provides rotational movement along an X axis, the second motor provides rotational movement along a Y axis, and the third motor provides rotational movement along a Z axis.

In yet another example, a process chamber includes a plurality of chamber walls having inner and outer surfaces, a chamber lid having a top surface and a bottom surface, a processing region defined by the inner surfaces of the plurality of chamber walls and the bottom surface of the chamber lid, a substrate support disposed in the processing region, a processing kit disposed around the substrate support, a lift pin disposed vertically through the substrate support, the lift pin comprising an optically transparent material, and an IR sensor mounted adjacent the lift pin and positioned to view the bottom surface of the chamber lid.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Apparatuses and methods for in situ temperature measurement of a process chamber are described herein. A process chamber includes an infrared (IR) sensor mounted to the chamber wall. The IR sensor generally measures infrared (IR) light radiating from objects in its field of view. For example, the IR sensor is positionable to receive an IR wave (i.e., light) emitted from a target inside or outside of the process chamber to measure the temperature of the target. More particularly, the IR sensor is mounted to the process chamber in a manner such that the IR sensor can be oriented to receive an IR wave from objects within the process chamber through a view port in the chamber wall to detect a temperature of an inside surface inside the chamber, or to receive an IR wave from an area outside of the process chamber to detect an atmospheric temperature or a temperature of an exterior surface of the process chamber. As the orientation of the IR sensor is controllable to receive the IR wave from selected directions, the IR may be used to detect the temperature of various targets inside the process chamber, including a bottom surface of the chamber lid or a surface of a process kit. The temperature information obtained using the positionable IR sensor is useful to improve overall chamber matching, processing throughput and uniformity.

Figure 1:
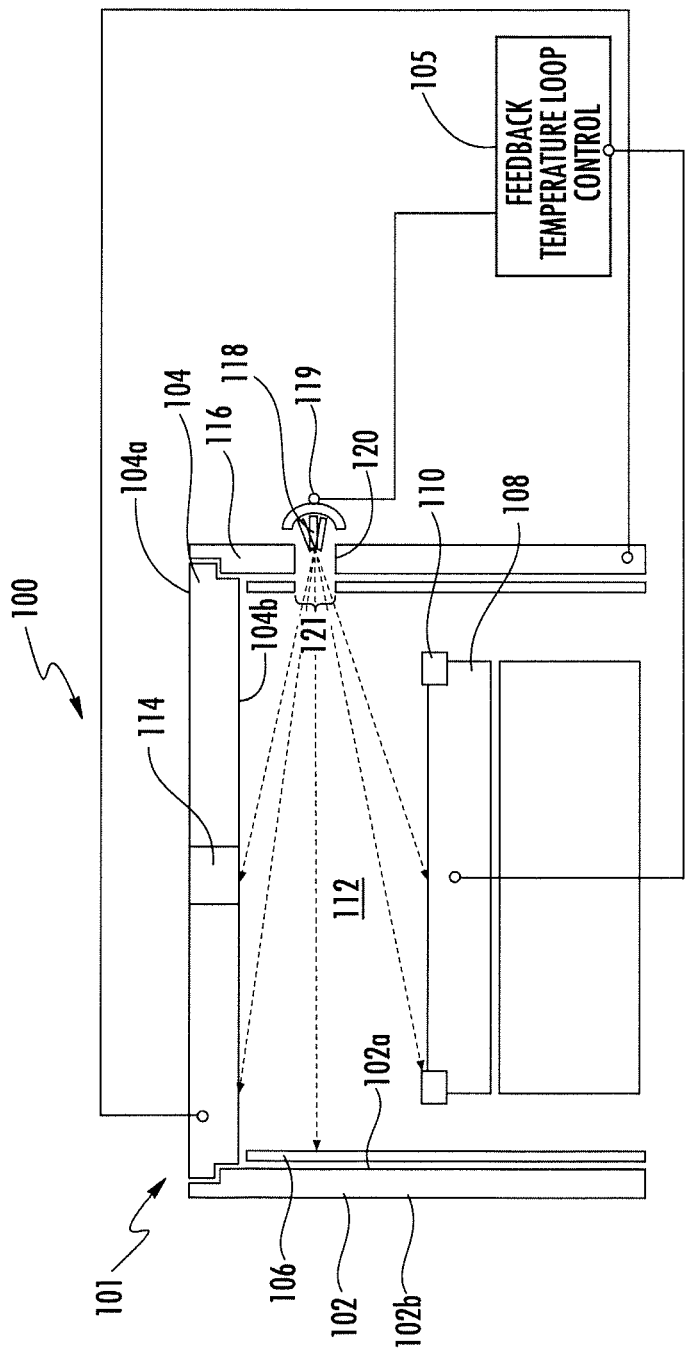
FIG. 1 is a cross-sectional view of a process chamber according to one example of the present disclosure.

FIG. 1 is a perspective view of a semiconductor process chamber 100 according to the present disclosure.

The process chamber 100 is illustratively described as an etch chamber, however, the disclosure contemplates other process chambers, including but not limited to pre-clean chambers, chemical vapor deposition (CVD) chambers, etch chambers, rapid thermal processing (RTP) chambers, and other plasma process chambers, may be adapted to benefit from the disclosure. Examples of the process chamber 100 that may be adapted to benefit from the disclosure herein include a MESA™ chamber, a SYM3®, or an ADVANT-EDGE™ chamber, each of which is supplied by Applied Materials, Inc. of Santa Clara, Calif.

The process chamber 100 generally includes a chamber body 101 defined by chamber walls 102 and chamber lid 104, a chamber liner 106, a substrate support 108, and a process kit 110. Each of the chamber walls 102 has an inner surface 102a and an outer surface 102b. The inner surfaces 102a are exposed to the inside of the chamber body and the outer surfaces 102b are exposed to atmosphere, i.e., the environment outside of the chamber body. The chamber lid 104 has an upper surface 104a and a bottom surface 104b. The bottom surface 104b is exposed to the inside of the chamber body and the upper surface 104a is exposed to atmosphere, i.e., the environment outside of the chamber body. A processing region 112 is defined by the inner surfaces 102a of the chamber walls 102 and the bottom surface 104b of the chamber lid 104.

The substrate support 108, which is generally an electrostatic chuck (ESC) is disposed in the processing region 112. The substrate support 108, or ESC, is generally manufactured from aluminum nitride (AlN) or aluminum oxide ($Al_2O_3$). The process kit 110 is disposed at least partially around the substrate support 108. In one example, the process kit 110 completely surrounds the substrate support 108.

The chamber liner 106 is generally manufactured from a metal or other suitable material, and may be coated with a coating compound. Suitable materials include anodized aluminum (Al) coated with yttrium compounds.

At least one view port 116 in formed in one of the chamber walls 102 or the chamber lid 104 of the chamber body. At least one infrared (IR) sensor 118 is mounted adjacent the view port 116 with a mounting system 119. The process chamber 100 may include more than one view port and more than one IR sensor.

The view port 116 includes a window 120. The window 120 generally includes material substantially transparent to the wavelengths expected to be received by the IR sensor 118 over the targeted temperature range to be measured. For example, in one example, the window 120 is manufactured from amorphous material transmitting infrared radiation-1 (AMTIR-1), $Ge_{33}As_{12}Se_{55}$. AMTIR-1 offers high optical homogeneity and may be used at temperatures up to 300 degrees Celsius (° C.). Moreover, AMTIR-1 is optically transparent to a wavelength of between about 8 μm and about 14 μm, and thus is generally used in applications for detecting temperatures in a range between about −40° C. and about 400° C., which corresponds to wavelengths between about 8 μm and about 14 μm. In other examples, corresponding to other targeted temperature ranges and wavelengths, the window 120 may be manufactured from other optically transparent materials such as quartz and sapphire.

The IR sensor 118 is generally selected to measure wavelengths expected the targeted temperature range. In one example, the IR sensor 118 is selected to detect a temperature between about −40° C. and about 400° C., which corresponds to wavelengths between about 8 μm and about 14 μm, and to measure the temperature with an accuracy of plus/minus 1.5 percent or ° C.

As shown in FIG. 1, the IR sensor 118 has a field of view 121 through the window 120. As discussed in detail below the IR sensor 118 can be oriented to receive an IR wave emitted from the surfaces of various targets within the field of view 121 inside the process chamber 100, including but not limited to the substrate support 108, the process kit 110, the chamber liner 106, a far edge of the bottom surface 104b of the chamber lid 104, and the center portion of the bottom surface 104b of the chamber lid 104. The IR sensor 118 may also be oriented to receive an IR wave emitted from targets, which are not shown, such as a showerhead.

Figure 2A:
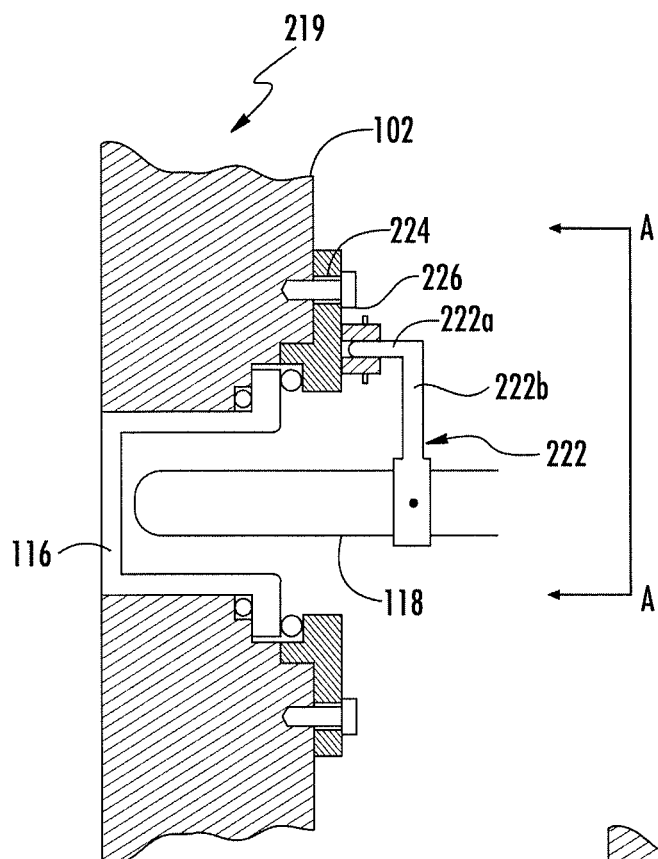
FIG. 2A is a detailed, cross-sectional view of a mounting system for coupling the IR sensor to the process chamber of FIG. 1.

FIG. 2A is a detailed, cross-sectional view of a mounting system 219 for coupling the IR sensor 118 to the process chamber 100 of FIG. 1.

Figure 2B:
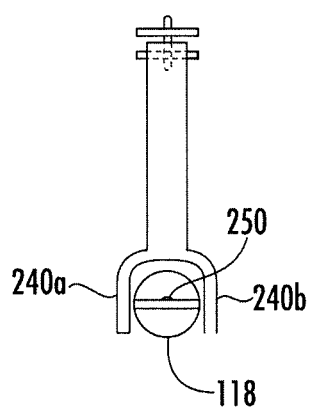
FIG. 2B is a cross-sectional view of a portion of FIG. 2A along view A-A.

FIG. 2B is a cross-sectional view of a portion of gimbal 222 of FIG. 2A along view A-A. Specifically, FIG. 2A shows a portion of the chamber wall 102, the view port 116, the mounting system 219, and the IR sensor 118. As discussed above, the view port 116 is a window of optically transparent material, such as AMTIR-1. The mounting system 219, which is configured to orient the IR sensor 118 to view a target within the field of view 121, generally includes one or more gimbals 222, one or more mounting plates 224, and one or more fasteners 226, such as screws, rivets, or bolts. The one or more gimbals 222, one or more mounting plates 224, and one or more fasteners 226 may be manufactured from metal, such as aluminum, or other suitable material.

The gimbal 222 is generally a pivoted support that allows the rotation of an object about a single axis. The gimbal 222 includes a first portion 222a and a second portion 222b. The first portion 222a is perpendicular to the second portion 222b and the second portion is configured to engage the IR sensor 118. As shown in FIG. 2, the gimbal 222 allows the IR sensor 118 to rotate in a horizontal plane, or along an X axis, around the vertical (Y) axis as shown in the A-A view. The X axis is generally parallel to a surface of a substrate support, such as the substrate support 108. The Y axis is generally perpendicular to the surface of a substrate support, such as the substrate support 108. The gimbal 222 may also be configured to allow the IR sensor 118 to be tilted at an angle from the horizontal (X) axis using a pin 250, which extends between a first fork arm 240a and a second fork arm 240b at a distal end of the second portion 222b of the gimbal 222. The pin 250 allows the IR sensor 118 to be pivoted to an angle from the X axis. The rotatability and tiltability of the IR sensor 118 allows the sensor to measure the temperature at the different targets inside and outside of the process chamber 100. The orientation of the gimbal 222 allows for the IR sensor 118 to be oriented to point to a target within the field of view 121. The gimbal 222 may be controlled manually or with one or more actuators, such as motors, as discussed below in FIGS. 4A-4C.

Figure 3:
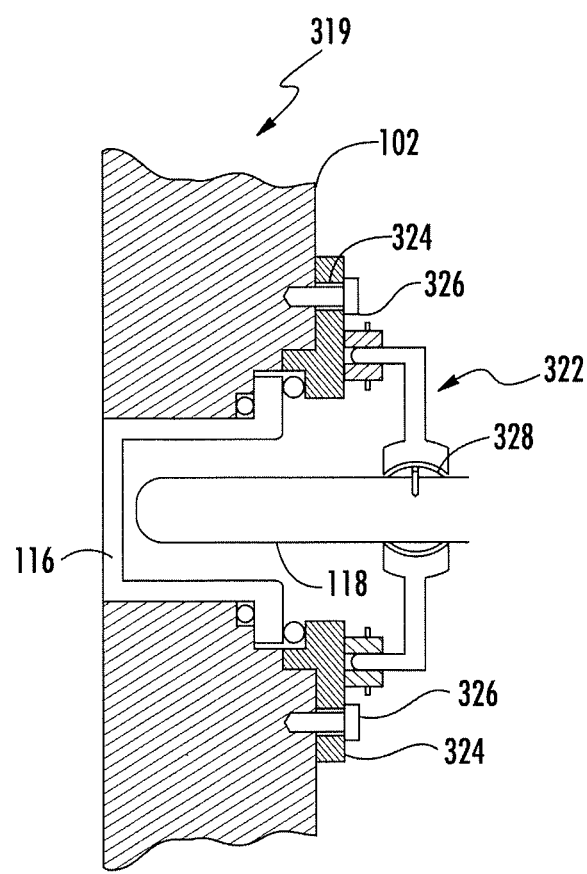
FIG. 3 is an alternative to FIG. 2 and is a detailed, cross-sectional view of an alternative mounting system for coupling the IR sensor to the process chamber of FIG. 1.

FIG. 3 is an alternative to FIG. 2 and is a detailed, cross-sectional view of an alternative mounting system 319 for coupling the IR sensor 118 to the process chamber 100 of FIG. 1. Specifically, FIG. 3 shows a portion of the chamber wall 102, the view port 116, the mounting system 319, and the IR sensor 118.

The mounting system 319 generally includes one or more gimbals 322, one or more mounting plates 324, and one or more fasteners 326, such as screws, rivets, or bolts. As shown in FIG. 3, the gimbal 322 provides three-dimensional (3D) rotation to the IR sensor 118. The one or more gimbals 322, one or more mounting plates 324, and one or more fasteners 326 may be manufactured from metal, such as aluminum, or other suitable material. Similar to the gimbal 222, the gimbal 322 allows the IR sensor 118 to be freely rotatable in a horizontal (X) axis and also allows the IR sensor 118 to be tilted at an angle from the horizontal (X) axis. As shown in FIG. 3, the gimbal 322 has a spherical housing portion 328, which provides an additional degree of freedom and allows the IR sensor 118 to further move in a Z axis.

Figure 4A:
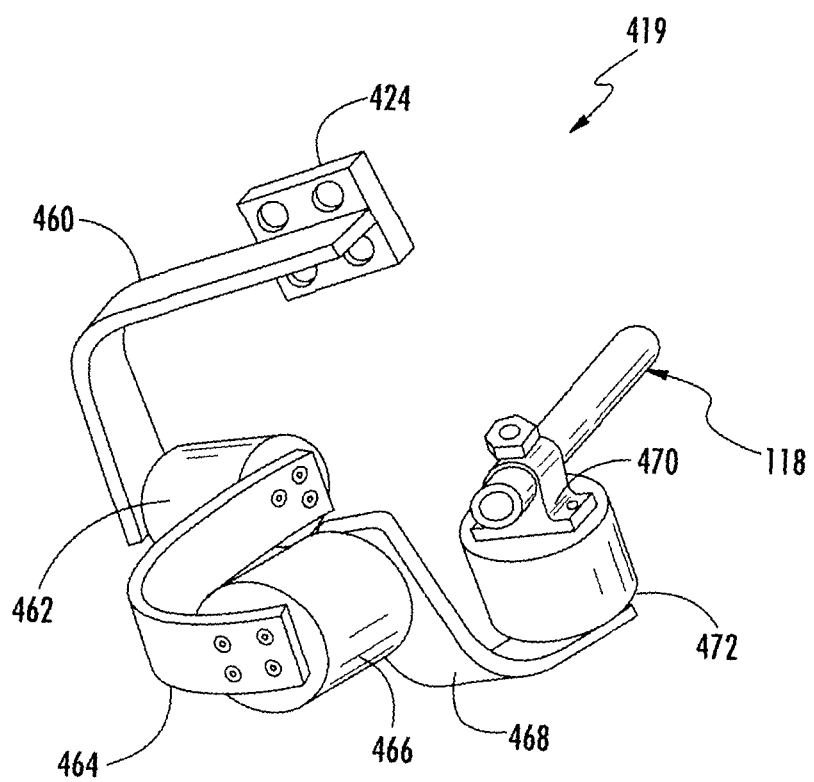
FIG. 4A is an alternative to FIGS. 2 and 3 and is a detailed, perspective view of an alternative mounting system for coupling the IR sensor to the process chamber of FIG. 1.
Figure 4B:
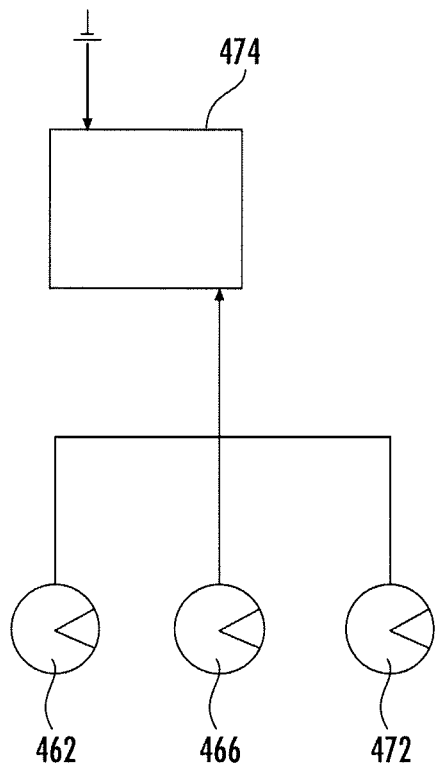
FIG. 4B is a block diagram of a controller of FIG. 4A.
Figure 4C:
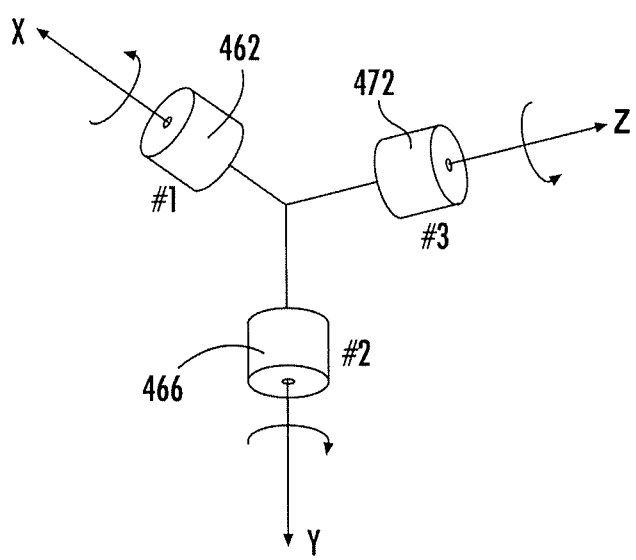
FIG. 4C illustrates the direction of rotational movement of the actuators of FIG. 4A.

FIG. 4A is an alternative to FIGS. 2 and 3 and is a detailed, perspective view of an alternative mounting system 419 for coupling the IR sensor 118 to the process chamber 100 of FIG. 1. FIG. 4B is a block diagram of a controller of FIG. 4A. FIG. 4C illustrates the direction of movement of the actuators of FIG. 4A.

The mounting system 419, which is configured to orient the IR sensor 118 to view a target within the field of view 121, generally includes a gimbal 422 and a mounting plate 424, which may be coupled to the process chamber 100 with one or more fasteners, such as screws, rivets, or bolts. The gimbal 422, which may be servo-controlled with feedback, generally includes a mounting bracket 460 coupled to a first intermediate bracket 464 by a first actuator 462, a second intermediate bracket 468 coupled to the first intermediate bracket 464 by a second actuator 466, and an IR sensor mounting bracket 470 coupled to the second intermediate bracket 468 by a third actuator 472. The brackets of the gimbal 422 and the mounting plate 424 may be manufactured from metal, such as aluminum, or other suitable material. In one example, the first actuator 462, the second actuator 466, and the third actuator 472 are motors. As shown in FIG. 4B, the first actuator 462, the second actuator 466, and the third actuator 472 are controlled by a controller 474. In one example, the controller 474 may be activated by and receive instructions for orienting the IR sensor mounting bracket 470 from a user. In another example, the controller 474 may be pre-programmed with instructions for orienting the IR sensor mounting bracket 470 from a user. As shown in FIG. 4C, the first actuator 462 is operable to rotate around a horizontal (X) axis, the second actuator 466 is operable to rotate around a vertical (Y) axis, and the third actuator 472 is operable to rotate around a Z axis. The X axis is substantially perpendicular to the Y axis, and wherein the Z axis is substantially perpendicular to the X axis and the Y axis. The IR sensor mounting bracket 470 is configured to orient the IR sensor 118 towards the window 120 of the process chamber 100.

In addition to providing a mechanism for orienting the IR sensor 118 to view targets in the field of view 121 of the process chamber 100, the use of the first actuator 462, the second actuator 466, and the third actuator 472 as the hinges in the gimbal 422 results in less rubbing between the various parts of the gimbal 422.

In operation, the IR sensor 118 may be used to measure the temperature outside or inside of the process chamber 100. The target for temperature measurement may be determined prior to operation of the IR sensor 118. For example, the IR sensor 118 may be used to measure the temperature at various targets inside the chamber, including, but not limited to the chamber liner 106, the process kit 110, or the bottom surface 104b of the chamber lid 104, which are inside the chamber body 101. Depending on the location of the mounting system of the IR sensor 118, the IR sensor 118 may also be used to measure the temperature at various targets outside the process chamber 100, including but not limited to, the outer surfaces 102b of the chamber body 101, the upper surface 104a of the chamber lid 104, an ICP source, an RF source, or a matching system.

When the surface on which the temperature is to be measured is outside of the chamber, the IR sensor 118 is pointed to the target, receives an IR wave emitted from the target, focuses the received IR wave on to a detector of the IR sensor 118, and the detector generates an electrical signal in response to the received IR wave that is indicative of the temperature of target. The electrical signal may include or be further processed to compensate for the material and angle of incidence of the target, and the like, such as further discussed below. The measured temperature data is then generally transmitted to a feedback temperature loop control 105. In the feedback temperature control loop 105, the received data can be compared with pre-calculated data (e.g., a plotted table) and adjusted as needed.

When the surface on which the temperature is to be measured is inside of the process chamber 100, other considerations, such as the presence of plasma within the processing region 112, are generally taken into account. More particularly, for example, after the IR sensor 118 has received an IR wave from the target, and the IR wave has been focused on a detector, which has generated an electrical signal in response to the received IR wave indicative of the temperature of the target, the temperature reading may need to be corrected for considerations, such as an angle of refraction. These corrections generally result in more accurate temperature readings. Other considerations include the inclination of surface of the target, for example a process kit may have a flat or angled surface relative to the orientation of the IR sensor 118. Generally, the IR sensor 118 is pointed to a target inside the chamber body 101 so the IR sensor 118 can receive an IR wave from the target. In order to point the IR sensor 118 to the target, the IR sensor 118 is tilted at an angle relative to the X axis or remains parallel to the X axis. Referring to the process chamber 200 for example, if the long axis of the IR sensor 118 is parallel to the X axis, or at an angle of 0°, then the IR sensor 118 may be aligned to receive an IR wave from the chamber liner 106 to measure the temperature of the chamber liner 106. If the long axis of the IR sensor 118 is tilted at a 15° angle from the X axis, the IR sensor 118 may receive an IR wave from the center region of the chamber lid 104 to measure the temperature of the center region of the chamber lid 104. If the long axis of the IR sensor 118 is tilted at a 20° angle from the X axis, the IR sensor 118 may receive an IR wave emitted from the edge region of the chamber lid 104 to measure the temperature of the edge region of the chamber lid 104. If the long axis of the IR sensor 118 is tilted at a −30° angle from the X axis, the IR sensor 118 may receive an IR wave emitted from the process kit 110 to measure the temperature of the process kit 110. In one example, several temperature readings may be taken at various positions on a target and then averaged for increased accuracy of the temperature measurement.

The process chamber 100 may include one or more IR sensors 118, each coupled to the process chamber 100 by one of mounting systems 119, 219 or 319 to measure various targets inside or outside of the chamber body 101. Each of the one more IR sensors 118 may be positioned to measure the temperature of a predetermined target throughout the manufacturing processes, or may be moved to various orientations to measure the temperature of various targets during the manufacturing processes.

Once the temperature has been measured, the temperature measurement is generally then delivered through a feedback temperature control loop 105, and the received temperature reading may be used to determine whether the temperature is within predetermine limits, or needs to be adjusted.

Generally, the temperature of the target will be measured in between semiconductor substrate transfers.

Figure 5:
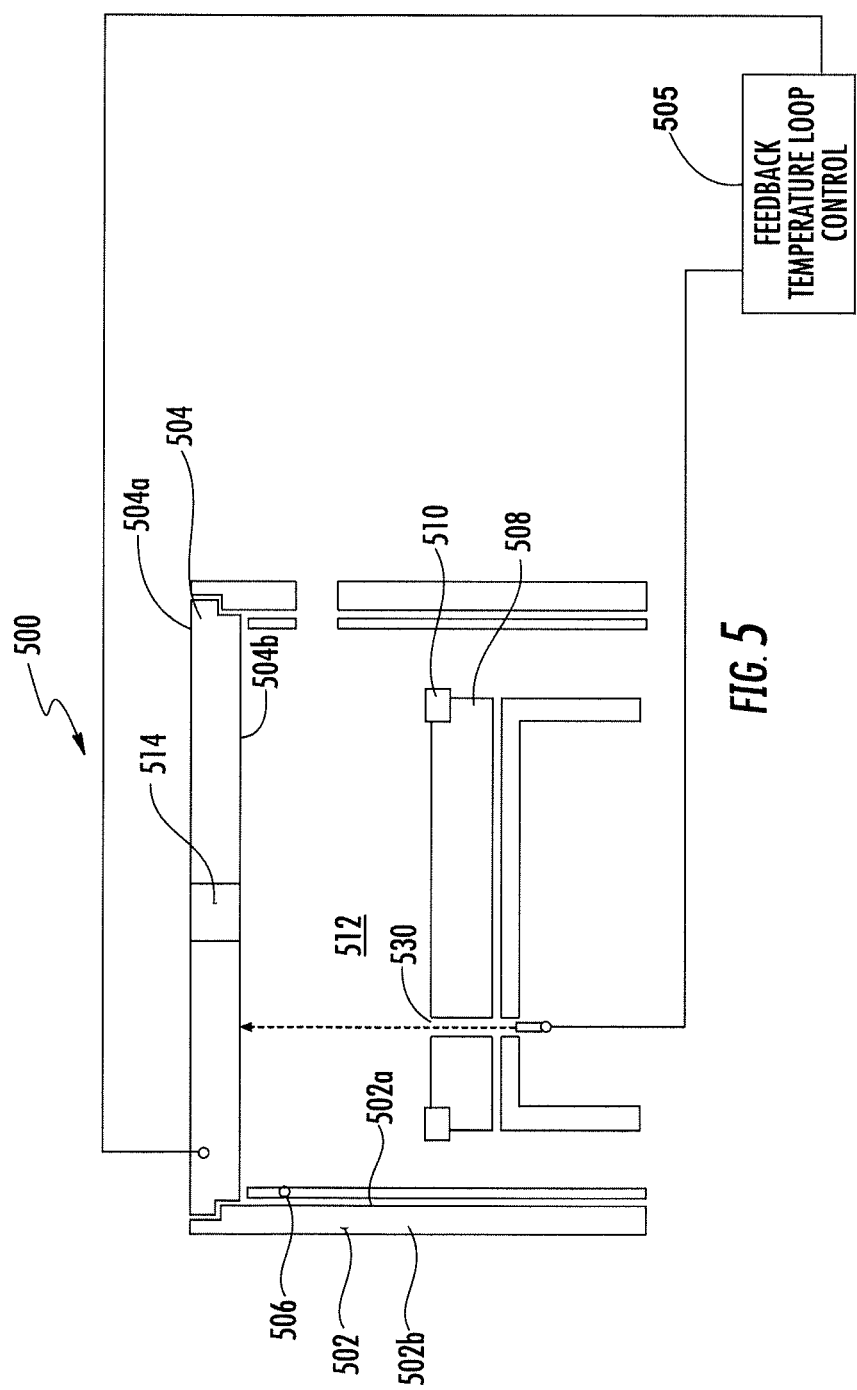
FIG. 5 is a cross-sectional view of a process chamber according to another example of the present disclosure.

FIG. 5 is a cross-sectional view of a process chamber 500 according to the present disclosure.

The process chamber 500 is similar to the process chamber 100, and generally includes chamber walls 502, a chamber lid 504, a chamber liner 506, a substrate support 508, and a process kit 510. Each of the chamber walls 502 has an inner surface 502a and an outer surface 502b. The chamber lid 504 has an upper surface 504a and a bottom surface 504b. A processing region 512 is defined by the inner surfaces 502a of the chamber walls 502 and the bottom surface 504b of the chamber lid. The chamber lid 504 generally includes a lid nozzle 514.

In process chamber 500, however, the IR sensor 118 is mounted below or positioned to extend through a location of a lift pin 530. While the IR sensor 118 is shown to be positioned below the lift pin 530, or extending partially through the lift pin 530. The IR sensor 118 may be positioned anywhere within the process chamber 500, or even outside of the process chamber 500, because a fiber optic cable can be used to connect with a remotely positioned IR sensor 118. Similar to the window 120 of the process chamber 100, the lift pin 530 is generally manufactured from a material which is transmissive to IR radiation. Alternatively, the lift pin 530 may have a plug which is generally manufactured from a material transmissive to IR radiation. The optically transparent material may be selected to correspond to wavelengths which correspond to the targeted temperature range. In one example, the lift pin 530 or plug is manufactured from AMTIR-1 ($Ge_{33}As_{12}Se_{55}$), which is optically transparent to a wavelength of between about 8 μm and about 14 μm, which corresponds to a temperature range between about −40° C. and about 400° C. The lift pin 530 or plug may be manufactured from other transparent materials, such as sapphire and quartz, for applications using wavelengths corresponding to their respective optical transparencies and temperature ranges.

In operation, the IR sensor 118 may be used to measure the temperature at the bottom surface 504b of the chamber lid 504. More particularly, the IR sensor 118 generally receives an IR wave emitted from the bottom surface 504b of the chamber lid 504, focuses the received IR wave on to a detector of the IR sensor 118, and the detector generates an electrical signal in response to the received IR wave that is indicative of the temperature of bottom surface 504b of the chamber lid 504. Once the temperature has been measured, the temperature measurement is generally then delivered through a feedback temperature control loop 505 and the received temperature reading may be used to determine whether the temperature at the target needs to be further controlled. In the feedback temperature control loop 505, the received data can be compared with pre-calculated data (e.g., a plotted table) and adjusted as needed.

The IR sensor 118 may be used to detect the temperature of the bottom surface 504b of the chamber lid 504 in between semiconductor substrate transfers. The IR sensor 118 positioned below or extending through the lift pin 530 may also be used to measure the temperature of the bottom surface 504b of the chamber lid 504 while a semiconductor substrate is in the process chamber 500 for processing when the semiconductor substrate is manufactured from a material that is transmissive to IR radiation.

The IR sensor 118 may be used alone in the process chamber 500, or may be used in conjunction with the IR sensors 118 described above. The process chamber 500 may include additional IR sensors.

The present disclosure provides apparatuses and methods for measuring the temperature of various targets inside and outside of a process chamber before, during, or after processing has occurred. The ability to measure temperature at the various targets and then transmitting the temperature through a feedback temperature loop control allows better process chamber control, which ultimately improves processing throughput and uniformity.

While the foregoing is directed to examples of the present disclosure, other and further examples of the disclosure may be devised without departing from the basic scope thereof, and the scope thereof is determined by the claims that follow.

What is claimed is:

1. A process chamber comprising:
    a chamber body of a semiconductor process chamber having sidewalls;
    a lid; and
    a temperature measurement kit further comprising:
        a view port disposed through at least one sidewall of the semiconductor process chamber, the view port having a window transmissive to IR radiation;
        a mounting bracket coupled to a first intermediate bracket by a first actuator;
        a second intermediate bracket coupled to the first intermediate bracket by a second actuator;
        an IR sensor mounting bracket coupled to the second intermediate bracket by a third actuator, the first actuator configured to provide rotational movement along an X axis, the second actuator configured to provide rotational movement along a Y axis, and the third actuator configured to provide rotational movement along a Z axis;
        an IR sensor mounted to the IR sensor mounting bracket, the IR sensor mounting bracket configured to reposition the IR sensor to measure an emitted wavelength through the view port of two or more regions of the processing chamber; and
        a mounting plate attached to the mounting bracket and the mounting plate is coupled to the chamber body using one or more fasteners.

2. The process chamber of claim 1, wherein the window is fabricated from AMTIR-1.

3. An in-situ temperature measurement kit comprising:
a chamber body of a semiconductor process chamber having sidewalls;
a view port disposed through at least one sidewall of the chamber body, the view port having a window transmissive to IR radiation;
a mounting system comprising:
a mounting bracket coupled to a first intermediate bracket by a first actuator;
a second intermediate bracket coupled to the first intermediate bracket by a second actuator; and
an IR sensor mounting bracket coupled to the second intermediate bracket by a third actuator, the first actuator configured to provide rotational movement along an X axis, the second actuator configured to provide rotational movement along a Y axis, and the third actuator configured to provide rotational movement along a Z axis, wherein the IR sensor mounting bracket is configured to hold an IR sensor and position the IR sensor to measure an emitted wavelength of one or more of the chamber body, a lid, a chamber liner, a process kit, or a substrate support of the semiconductor process chamber; and
a first mounting plate coupled to the mounting bracket and attaching the mounting bracket to the semiconductor process chamber using one or more fasteners.

4. The in-situ temperature measurement kit of claim 3, wherein the window is
disposed adjacent the first mounting plate.

5. The in-situ temperature measurement kit of claim 4, wherein the window comprises AMTIR-1.

6. The in-situ temperature measurement kit of claim 4, wherein the IR sensor mounting bracket is configured to orient an IR sensor towards the window.

7. The in-situ temperature measurement kit of claim 4, wherein the IR sensor mounting bracket is configured to orient an IR sensor in a direction in which the first mounting plate faces.

8. The in-situ temperature measurement kit of claim 3, wherein the X axis is substantially perpendicular to the Y axis.

9. The in-situ temperature measurement kit of claim 3, wherein the Z axis is substantially perpendicular to the X axis and the Y axis.

10. An in-situ temperature measurement kit comprising:
a chamber body of a semiconductor process chamber having sidewalls;
a view port disposed through at least one sidewall of the chamber body, the view port having a window transmissive to IR radiation;
a mounting plate attached to a semiconductor process chamber using one or more fasteners; and
a mounting system comprising:
a mounting bracket coupled to the mounting plate;
a first intermediate bracket coupled to the mounting bracket by a first actuator;
a second intermediate bracket coupled to the first intermediate bracket by a second actuator; and
an IR sensor mounting bracket coupled to the second intermediate bracket by a third actuator, the first actuator configured to act as a hinge between the first intermediate bracket and the mounting bracket and providing rotational movement along an X axis, the second actuator configured to act as a hinge between the first intermediate bracket and the second intermediate bracket and providing rotational movement along a Y axis, and the third actuator configured to act as a hinge between the second intermediate bracket and the IR sensor mounting bracket and providing rotational movement along a Z axis, wherein the IR sensor mounting bracket is configured to hold an IR sensor.

11. The in-situ temperature measurement kit of claim 10, wherein the window is
disposed adjacent the mounting plate.

12. The in-situ temperature measurement kit of claim 11, wherein the window comprises AMTIR-1.

13. The in-situ temperature measurement kit of claim 11, wherein the IR sensor mounting bracket is configured to orient an IR sensor towards the window and measure an emitted wavelength of one or more of the chamber body, a lid, a chamber liner, a process kit, or a substrate support of a process chamber.

14. The in-situ temperature measurement kit of claim 11, wherein the IR sensor mounting bracket is configured to orient an IR sensor in a direction in which the mounting plate faces.

15. The in-situ temperature measurement kit of claim 10, wherein the X axis is substantially perpendicular to the Y axis and the Z axis is substantially perpendicular to the X axis and Y axis.

16. The in-situ temperature measurement kit of claim 10, wherein the mounting plate and the mounting bracket comprise a metal material.

17. The in-situ temperature measurement kit of claim 10, wherein the first actuator, the second actuator, and the third actuator are motors controlled by a controller.

* * * * *